United States Patent
Dannemann

(10) Patent No.: US 6,654,312 B1
(45) Date of Patent: Nov. 25, 2003

(54) METHOD OF FORMING A LOW VOLTAGE SEMICONDUCTOR STORAGE DEVICE AND STRUCTURE THEREFOR

(75) Inventor: Lars Hagen Dannemann, Chandler, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 10/228,399

(22) Filed: Aug. 27, 2002

(51) Int. Cl.[7] ............................. G11C 8/00; H03K 3/289
(52) U.S. Cl. ........................................ 365/233; 327/202
(58) Field of Search .................................. 365/233, 203, 365/205; 327/202, 203, 208

(56) References Cited

U.S. PATENT DOCUMENTS 4,999,528 A * 3/1991 Keech ........................ 327/198
6,573,775 B2 * 6/2003 Pilling ........................ 327/202

* cited by examiner

*Primary Examiner*—Anh Phung
(74) *Attorney, Agent, or Firm*—Robert F. Hightower

(57) ABSTRACT

A storage element (16) is formed to have a reset signal (R,RB) that overrides the operation of a clock signal (C,CB). The storage element has two voltage swings used for two different internal logic levels. The storage element (16) is also formed to ensure that the two voltage levels do not saturate the transistors within the storage element (16).

19 Claims, 3 Drawing Sheets ial amplifier. Similarly, slave section 24 includes a
METHOD OF FORMING A LOW VOLTAGE SEMICONDUCTOR STORAGE DEVICE AND STRUCTURE THEREFOR

BACKGROUND OF THE INVENTION

The present invention relates, in general, to electronics, and more particularly, to methods of forming semiconductor devices and structures.

In the past, the semiconductor industry utilized various techniques for forming high-frequency storage elements that operated at high frequencies. Forming devices storage elements such as D-type flip-flops that operate at frequencies near an above 10 GHz. Additionally, forming such storage elements that operate at high frequencies and at low voltages such as about 2.5 volts or less is even more difficult. Such low voltages prevent proper operation of internal transistors within the storage elements thereby preventing operation at the high frequencies. In some storage elements, the low voltage caused some transistors to saturate thereby further limiting the operating frequencies.

Accordingly, it is desirable to have a storage element that can operate at frequencies of at least 10 GHz, operate at power supply voltages of about 2.5 V or less, and that do not have internal transistors that saturate.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

The present description includes, among other features, a method of forming a storage element that operates at power supply voltages of 2.5 volts or less, that can operate at frequencies greater than ten giga Hertz (10 GHz) at such low voltages, and that does not have transistors in saturation at such low voltages.

Figure 1:
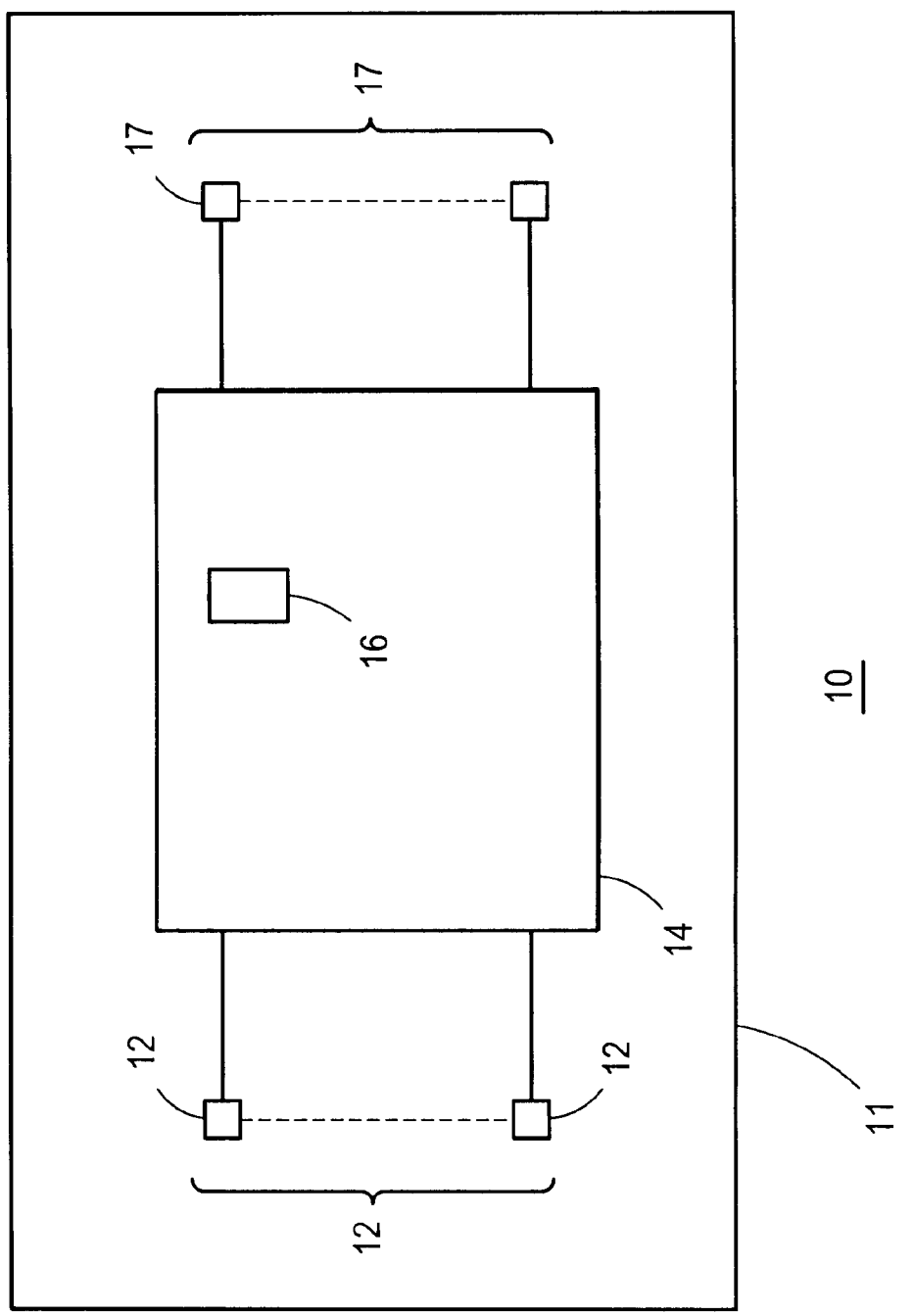
FIG. 1 schematically illustrates an enlarged plan view of an embodiment of a portion of a semiconductor device with the present invention.

FIG. 1 schematically illustrates an enlarged plan view of an embodiment of a semiconductor device 10 that is formed on a semiconductor die 11. Semiconductor device 10 includes a semiconductor circuit 14 that typically has a plurality of inputs 12 and a plurality of outputs 17. Circuit 14 includes a storage element or D-type flip flop 16 that is formed on semiconductor die 11. Flop 16 has outputs that typically are coupled to outputs 17 and inputs that generally are coupled to inputs 12.

Figure 2:
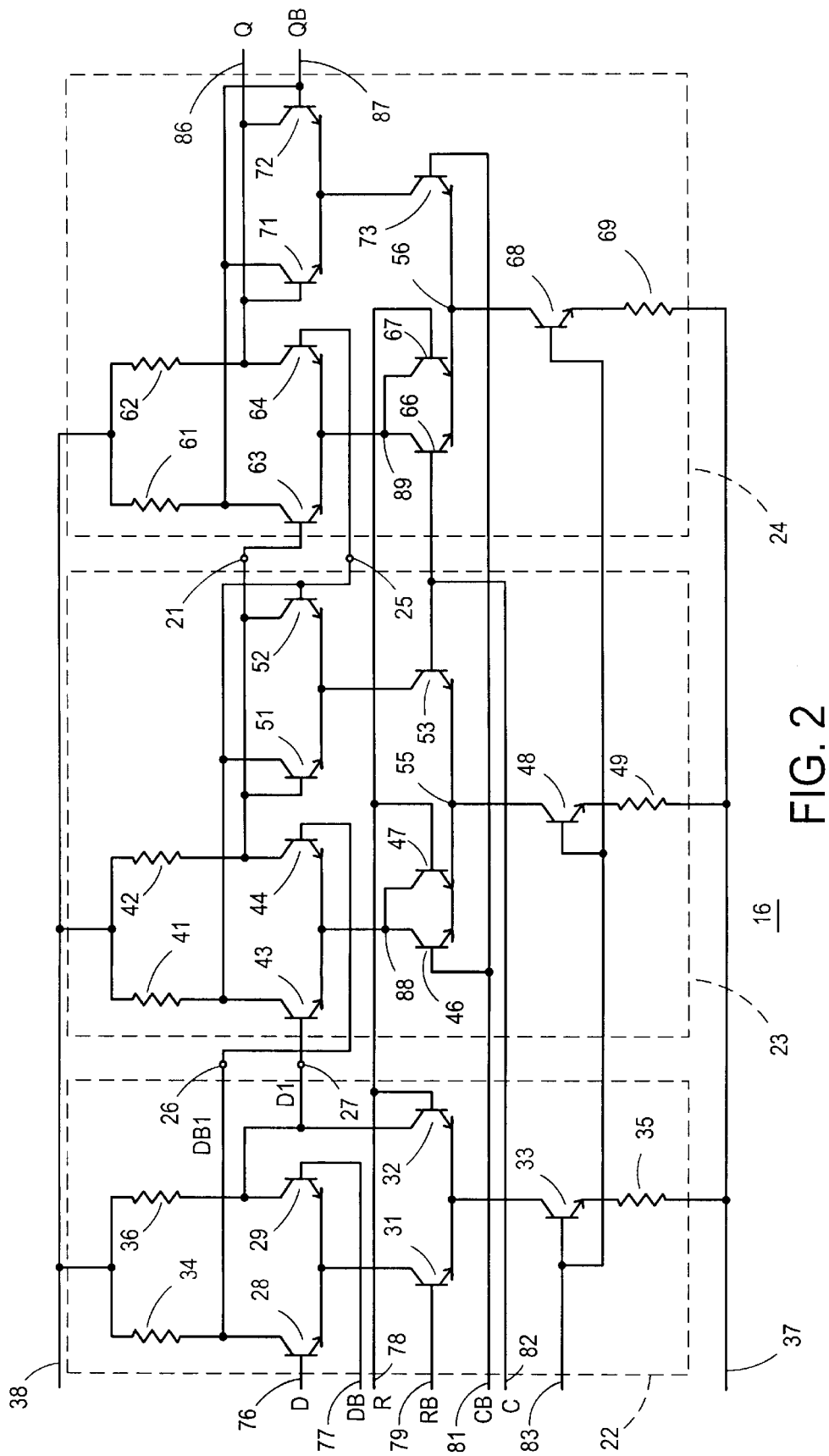
FIG. 2 schematically illustrates an embodiment of a portion of a D-type flip flop in accordance with the present invention.

FIG. 2 schematically illustrates a portion of an embodiment of flop 16 that is shown in FIG. 1. Flop 16 includes an input stage 22, a master latch or master section 23, and a slave latch or slave section 24. Flop 16 has a plurality of inputs including a data (D) input 76 which receives a data signal for flop 16 and a data bar (DB) input 77 which receives a signal that has an opposite state to the signal on input 76. Flop 16 also has control inputs that receive control signals including a reset (R) input 78, a reset bar (RB) input 79, a clock (C) input 82, and a clock bar (CB) input 81. Reset bar (RB) input 79 and clock bar (CB) input 81 receive signals that have a state opposite to the signals on inputs 78 and 82, respectively. Additionally, flop 16 has a power input 38 and a power return 37 that function to supply operating power to flop 16.

Master section 23 includes a differential amplifier formed by a transistor 43, a transistor 44, and resistors 41 and 42. Section 23 also includes a pair of output transistors, as a transistor 51 and a transistor 52, that latch the state of the differential amplifier. Similarly, slave section 24 includes a differential amplifier formed by a transistor 63, a transistor 64, and resistors 61 and 62. Also section 24 also includes a pair of output transistors, as a transistor 71 and a transistor 72, that latch the state of the differential amplifier.

A bias voltage is received by a bias voltage input or bias input 83 and is used for biasing current source transistors within flop 16. As those skilled in the art will understand, transistors 33, 48, and 68 are current sources that are biased to have a constant current flowing through each transistor. The bias voltage is received on a bias input 83 and applied to the base of transistors 33, 48, and 68 in order to facilitate generating the constant current. A pair of switch transistors are formed in series between each differential amplifier and each respective current source transistor to facilitate interrupting current flow through the respective differential amplifier and facilitate operating flop 16 as will be described hereinafter. A transistor 46 and a transistor 47 form one pair of switch transistors, and a transistor 66 and a transistor 67 form another pair of switch transistors.

Figure 3:
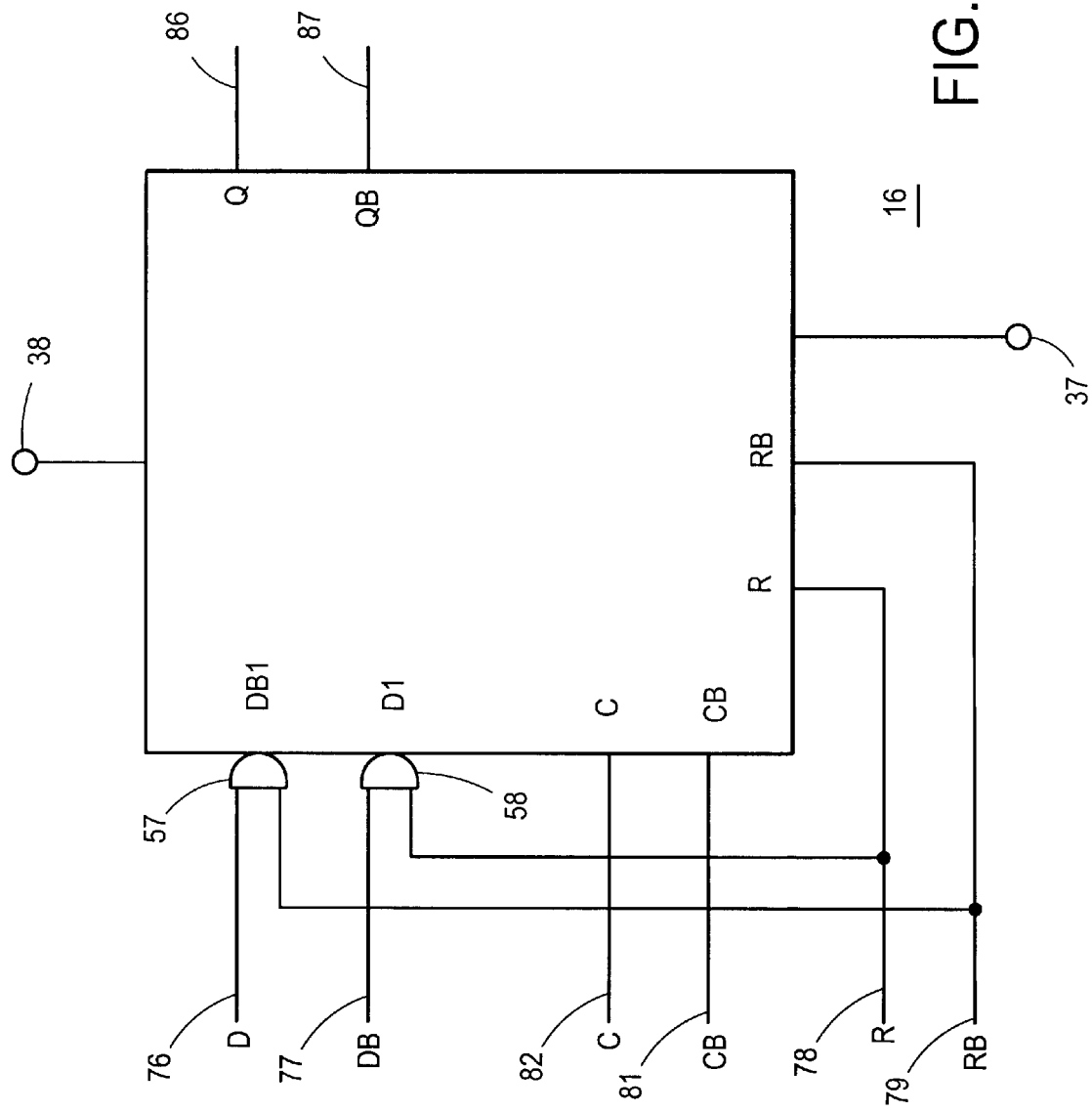
FIG. 3 schematically illustrates an embodiment of a portion of a function block symbol for the D-type flip flop shown in FIG. 2 in accordance with the present invention.

Input stage 22 includes a pair of "AND" gates that provide inputs to master section 23. These gates are illustrated in FIG. 3 by a first input gate 57 and a second input gate 58. Gate 58 receives the signals on data bar (DB) input 77 and reset (R) input 78 and forms a data prime (D1) signal on a data prime (D1) node 27 as a first data input to master section 23. Gate 57 receives the signals on data (D) input 76 and reset bar (RB) input 79 and forms a date prime bar (DB1) signal on a date prime bar (DB1) node 26 as a second data input to master section 23.

In the following descriptions, voltage values are given relative to the value of the voltage applied to input 38. For example, if the value of the voltage applied to input 38 is zero or ground, then a voltage value of −1.2 volts is equal to a value of zero minus 1.2 (0−1.2). Also the term high means a signal having a voltage value that is near to the value of the voltage on input 38 and is a value that enables a transistor, and the term low means a signal having a voltage value that is further from the value of the voltage at input 38 than the high signal is from the value of input 38 and is a value that disables a transistor. For example, a high may be a voltage of −0.9 volts while a low may be a voltage of −1.2 volts.

For clarity, the following descriptions refer to both FIG. 2 and FIG. 3. As will be seen hereinafter, flop 16 is formed so that, among other features, the operation of reset (R) input 78 overrides the function of clock (C) input 82 for slave section 24 and of clock bar (CB) input 81 for master section 23, and forces a reset state on an output (Q) 86 and a set state on an output bar (QB) output 87.

During normal operation of flop 16, reset (R) input 78 is low and reset bar (RB) input 79 is high. In this state, a transistor 32 is disabled and a transistor 31 is active so that the value applied to data (D) input 76 is reflected at data bar prime (DB1) node 26, and the value applied to data bar (DB) input 77 is reflected at data prime (D1) node 27. Since reset (R) input 78 is low, transistors 47 and 67 are disabled allowing master section 23 and slave section 24 to be controlled by the signals applied to clock (C) input 82 and clock bar (CB) input 81. Thus, transistors 53 and 66 are controlled by the state of clock (C) input 82, and transistors 46 and 73 are controlled by the state of clock bar (CB) input 81. When clock bar (CB) input 81 is high in this normal operating mode, transistor 46 is active but transistors 47 and 53 are disabled, thus, transistors 51 and 52 are also disabled. Consequently, the value at nodes 26 and 27 is reflected at nodes 21 and 25, respectively by transistors 43 and 44. Also in this condition, transistors 66 and 67 are disabled but transistor 73 is enabled along with transistors 71 and 72. Because transistors 71 and 72 are enabled, they store or latch the previous state of the signals on outputs 86 and 87 and these signals remain applied to outputs 86 and 87. Because transistor 67 is disabled, the state at nodes 21 and 25 is not reflected to outputs 86 and 87. When clock bar (CB) input 81 goes low and clock (C) input 82 goes high, transistor 53 is enabled and transistors 51 and 52 are enabled to store or latch the value at nodes 21 and 25 while transistor 46 becomes disabled. Transistor 66 is enabled but transistor 73 is disabled, thus, the value at nodes 21 and 25 is reflected to outputs 86 and 87 through enabled transistors 63, 64, and 66 while transistors 71 and 72 are disabled and have no effect on the signals. When clock and clock bar once again change state, transistor 73 is enabled and transistors 71 and 72 are enabled to store or latch the value of outputs 86 and 87.

During a reset operation, reset (R) input 78 goes high and reset bar (RB) input 79 goes low. When reset bar (RB) input 79 goes low, transistor 31 is disabled and data bar prime (DB1) node 26 is forced high through a resistor 34. When reset (R) input 78 goes high, transistor 32 is enabled to force a low level at data prime (D1) node 27. The high level applied to reset (R) input 78 also enables transistors 47 and 67 to force a first clock node 88 and a second clock node 89, respectively, low which enables transistors 43 and 44 to propagate the values at nodes 26 and 27 through master section 23 to nodes 21 and 25, respectively. The high level applied to reset (R) input 78 enables transistors 63 and 64 to propagate the values at nodes 21 and 25 to outputs 86 and 87, respectively. Because the reset and reset bar signals have a larger high voltage value and a lower low voltage value than clock and clock bar signals, the clock and clock bar signals do not affect the state of outputs 86 and 87 while reset is high and reset bar is low. When reset (R) goes low and reset bar (RB) goes high to enable normal operation, flop 16 returns to a reset state. If reset (R) goes low and clock is low, transistors 71 and 72 are holding the reset state forcing output (Q) 86 low and output bar (QB) 87 high. If reset (R) goes low and clock is high, transistors 51 and 52 are holding the reset state on nodes 21 and 25 which sets output (Q) 86 low and output bar (QB) 87 high through transistors 63 and 64. Transistors 71 and 72 hold these values until the next rising edge on clock (C) input 82 which enables transistors 63 and 64 to receive the signals on nodes 21 and 25. Nodes 21 and 25 were changed through a low on clock (C) input 82 which enables transistors 43 and 44 to receive the value of the signals on nodes 26 and 27 and transfer the value to outputs 86 and 87.

As can be seen from the operation and from FIG. 2, flop 16 only has two levels of stacked transistors. For example, there are two levels from input 76 across the base-emitter junction of transistor 28, through transistor 31 and the base-emitter junction thereof. Similar paths from input 77 and each output result in only two levels of stacked transistors. These two levels allow flop 16 to operate with lower power supply voltages than devices with more than two levels.

In order to ensure that reset (R) input 78 and reset bar (RB) input 79 override clock (C) input 82 and clock bar (CB) input 81, the reset and reset bar signals are given a voltage swing that is larger than the voltage swing of the clock and clock bar signals. Connecting transistors 46 and 47 in parallel and transistors 66 and 67 in parallel ensures that the larger voltage swing of the reset signal will override the clock signal. Additionally, connecting transistors 46 and 66 in parallel with transistors 47 and 67 minimizes the number of stacked transistor levels that are required by flop 16 and reduces the value of the operating voltage that is required by flop 16, thereby minimizing saturation problems within flop 16.

The worst case condition for saturation occurs during a normal operating condition when reset (R) input 78 is low, clock (C) input 82 is high, and clock bar (CB) input 81 is low. Consequently, the voltage values and swings of inputs 78, 79, 81, and 82 are chosen to prevent saturation of current source transistors 48 and 68. In the preferred embodiment, the reset (R) and reset bar (RB) signals have a voltage swing that is approximately from −0.9 volts to −1.2 volts, the clock (C) and clock bar (CB) signals have a voltage swing that is approximately from −0.93 to −1.13 volts, and the data (D) and data bar (DB) signals have a voltage swing that is approximately from 0.00 to −0.20 volts. Thus, flop 16 operates with three logic levels but only two levels of stacked transistors. Other values may be used as long as the reset (R) and reset bar (RB) signals swing to higher and low voltages than the clock (C) and clock bar (CB) signals. When reset (R) input 78 is low, the value of the voltage applied to reset (R) input 78 and to the base of transistors 47 and 67 is about −1.2 Volts. When clock (C) input 82 is high, clock bar (CB) input 81 is low, thus, the value of the voltage applied to clock (C) input 82 and to the base of transistor 53 is −0.93 volts and the value of the voltage applied to clock bar (CB) input 81 and to the base of transistor 46 is −1.13 volts. Under these conditions, transistor 46 is disabled and transistor 53 is enabled and has a corresponding base-emitter voltage drop of about 0.9 volts. Thus the voltage at a node 55 is about −1.83 volts ((−0.93)−(0.9)=−1.83). The base of transistor 48 has the bias voltage which typically is about one volt greater than the voltage applied to return 37. In the preferred embodiment, the voltage is about −2.5 volts plus or minus five percent (2.5V±5%). Thus the voltage across the base-collector junction of transistor 48 is about 0.455 volts (−1.83(−1.375)=−0.455). This is less than the maximum allowable voltage of 0.5 volts, thus, transistor 48 is protected from saturation conditions. A voltage greater than about 0.5 volts causes saturation of transistors 48 and 68 thereby reducing the current regulation and decreasing the switching time of flop 16. Consequently at power supply voltages of about 2.5 volts or less, flop 16 does not have transistors in saturation and can operate at frequencies of ten giga Hertz (10 GHz) or higher.

To facilitate, among other features, the operating functions hereinbefore described, flip flop 16 has input 76 connected to a base of a transistor 28 and input 77 connected to a base of a transistor 29. A collector of transistor 28 is connected to node 26 and to input 38 through a resistor 34, and a collector of transistor 29 is connected node 27 and to input 38 through a resistor 36. The emitters of transistors 28 and 29 are connected together and to a collector of transistor 31. A base of transistor 31 is connected to input 79 and an emitter connected to an emitter of transistor 32. A base of transistor 32 is connected input 78, and a collector is connected to node 27. An emitter of transistors 31 and 32 are connected to a collector of transistor 33. A base of transistor 33 is connected to input 83 and an emitter is connected to return 37 through a resistor 35.

Transistor 43 has a base connected to node 27, a collector connected to input 38 through a resistor 41. A collector of transistor 44 is connected to input 38 through a resistor 42, and a base of transistor 44 is connected to node 26. The emitters of transistors 43 and 44 are connected together and to a collector of transistors 46 and 47. A base of transistor 46 is connected to input 81, and a base of transistor 47 is connected to input 78 while the emitters of transistors 46 and 47 are connected to node 55 and to a collector of transistor 48. A base of transistor 48 is connected to input 83, and an emitter is connected to return 37 through a resistor 49. A base of transistor 51 is connected to node 21 and to a collector of transistor 44, a collector of transistor 51 is connected to node 25 and to a collector of transistor 43. A collector of transistor 52 is connected to node 21 and a base is connected to node 25. The emitters of transistors 51 and 52 are connected to a collector of transistor 53. A base of transistor 53 is connected to input 82 and an emitter is connected to node 55.

Transistor 63 has a base connected to node 21, and a collector connected to input 38 through a resistor 61. Transistor 64 has a base connected to node 25 and a collector connected to input 38 through a resistor 62. The emitters of transistors 63 and 64 are connected to node 89 and to the collectors of transistor 66 and 67. A base of transistor 66 is connected to input 82, and a base of transistor 67 is connected to input 78. The emitters of transistors 66 and 67 are connected to a node 56 and to a collector of transistor 68. Transistor 68 has a base connected to input 83 and an emitter connected to return 37 through a resistor 69. Transistor 71 has a base connected to output 86 and to a collector of transistor 64, a collector connected to output 87 and to a collector of transistor 63. A base of transistor 72 is connected to output 87 and a collector is connected to output 86. An emitter of transistors 71 and 72 are connected to a collector of transistor 73. An emitter of transistor 73 is connected to node 56 and a base is connected to input 81.

FIG. 3 schematically illustrates an embodiment of a portion of a function block symbol for flop 16 that is shown in FIG. 2.

In view of all of the above, it is evident that a novel device and method is disclosed. Included, among other features, is a method of forming a flip flop that has less than two levels of stacked transistors thereby facilitating operation at low voltages without saturation, that has a reset function that overrides a clock function at the low voltages, and that operates at frequencies of ten giga Hertz or more at the low voltages. Although the invention is described for a particular D-type flip flop, the method is applicable to other types of storage elements including other D-type flip flops and to other types of flip flops.

What is claimed is:

1. A method of forming a storage element comprising:

forming the storage element to responsively operate with a first control signal responsive to a first voltage swing, and a second control signal responsive to a second voltage swing that is greater than the first voltage swing;

coupling a first clock transistor to receive the first control signal;

coupling a first reset transistor to receive the second control signal; and coupling the first clock transistor in parallel with the first reset transistor.

2. The method of claim 1 further including forming the first reset transistor and the first clock transistor as a switch coupled interrupt current through a first differential amplifier.

3. The method of claim 2 further including forming the first clock transistor and the first reset transistor in series between the first differential amplifier and a current source.

4. The method of claim 2 further including forming a pair of output transistors coupled to store a state of the first differential amplifier.

5. The method of claim 1 further including coupling a second clock transistor to receive a third control signal having the first voltage swing; coupling a second reset transistor to receive the second control signal; and coupling the second clock transistor in parallel with the second reset transistor.

6. The method of claim 5 further including forming the second reset transistor and the second clock transistor as a switch coupled to interrupt current through a second differential amplifier.

7. The method of claim 6 further including forming the second clock transistor and the second reset transistor in series between the second differential amplifier and a current source.

8. The method of claim 6 further including coupling a pair of output transistors coupled to latch a state of the second differential amplifier.

9. A storage element comprising:

a first differential amplifier;

a first clock transistor coupled to receive a first control signal having a first voltage swing; and a first reset transistor coupled in parallel with the first clock transistor wherein the first reset transistor is coupled to receive a second control signal having a second voltage swing that is greater than the first voltage swing and wherein the first clock transistor and the first reset transistor are coupled to control a current flow through the first differential amplifier.

10. The storage element of claim 9 further including a current source transistor coupled to supply the current flow through the first differential amplifier wherein the first reset transistor is coupled in series between the current source transistor and the first differential amplifier.

11. The storage element of claim 9 further including a first pair of transistors coupled to store a state of the first differential amplifier.

12. The storage element of claim 9 further including a second differential amplifier;

a second clock transistor coupled to receive a third control signal having the first voltage swing; and a second reset transistor coupled in parallel with the second clock transistor wherein the second reset transistor is coupled to receive the second control signal and wherein the second clock transistor and the second reset transistor are coupled to control current flow through the second differential amplifier.

13. The storage element of claim 12 further including a second pair of transistors coupled to store a state of the second differential amplifier.

14. A storage element comprising:
- a first clock transistor having a first current carrying electrode coupled to a first node, a second current carrying electrode coupled to a second node, and a control electrode coupled to receive a first clock signal;
- a first reset transistor having a first current carrying electrode coupled to the first current carrying electrode of the first clock transistor, a second current carrying electrode coupled to the second node, and a control electrode coupled to receive a first reset signal;
- a first transistor having a first current carrying electrode coupled to the first node, a second current carrying electrode coupled to receive a power input, and a control electrode;
- a second transistor having a first current carrying electrode coupled to the first node, a second current carrying electrode coupled to receive the power input, and a control electrode; and
- a first current source transistor having a first current carrying electrode coupled to the second node, a second current carrying electrode coupled to a power return, and a control electrode coupled to receive a bias voltage.

15. The storage element of claim 14 further including a first output transistor having a first current carrying electrode coupled to the second node, a control electrode coupled to receive a second clock signal, and a second current carrying electrode.

16. The storage element of claim 15 further including a second output transistor having a first current carrying electrode coupled to the second current carrying electrode of the first transistor, a control electrode coupled to the second current carrying electrode of the second transistor, and a second current carrying electrode coupled to the second current carrying electrode of the first output transistor; and a third output transistor having a first current carrying electrode coupled to the second current carrying electrode of the second transistor, a second current carrying electrode coupled to the second current carrying electrode of the first output transistor, and a control electrode coupled to the second current carrying electrode of the first transistor.

17. The storage element of claim 14 further including a second clock transistor having a first current carrying electrode coupled to a third node, a second current carrying electrode coupled to a fourth node, and a control electrode coupled to receive a second clock signal; a second reset transistor having a first current carrying electrode coupled to the third node, a second current carrying electrode coupled to the fourth node, and a control electrode coupled to receive the first reset signal; a third transistor having a first current carrying electrode coupled to receive the power input, a second current carrying electrode coupled to the third node, and a control electrode coupled to receive a first data signal; a fourth transistor having a first current carrying electrode coupled to the power input, a second current carrying electrode coupled to the third node, and a control electrode coupled to receive a second data signal; and a second current source transistor having a first current carrying electrode coupled to the fourth node, a second current carrying electrode coupled to the power return, and a control electrode coupled to receive the bias voltage.

18. The storage element of claim 17 further including a first output transistor having a first current carrying electrode coupled to the fourth node, a control electrode coupled to receive the first clock signal, and a second current carrying electrode.

19. The storage element of claim 18 further including a second output transistor having a first current carrying electrode coupled to the first current carrying electrode of the third transistor, a control electrode coupled to the first current carrying electrode of the fourth transistor, and a second current carrying electrode coupled to the second current carrying electrode of the first output transistor; and a third output transistor having a first current carrying electrode coupled to the first current carrying electrode of the fourth transistor, a second current carrying electrode coupled to the second current carrying electrode of the first output transistor, and a control electrode coupled to the first current carrying electrode of the third transistor.

* * * * *